United States Patent [19]

Newton et al.

[11] Patent Number: 6,020,862
[45] Date of Patent: Feb. 1, 2000

[54] METHOD FOR MAKING NON-PLANAR RADIO FREQUENCY DEVICE AND DEVICE PRODUCED THEREBY

[75] Inventors: Charles M. Newton, Palm Bay; William D. Killen, Satellite Beach; Thomas P. Smyth, Palm Bay, all of Fla.

[73] Assignee: Harris Corporation, Melbourne, Fla.

[21] Appl. No.: 09/057,676

[22] Filed: Apr. 9, 1998

[51] Int. Cl.⁷ .................................. H05K 3/12; H01Q 1/24
[52] U.S. Cl. .................................. 343/872; 343/700 MS; 29/848; 29/846; 174/255
[58] Field of Search ..................... 343/872, 718, 343/700 MS; 29/848, 846, 849, 600; 174/255, 68.5, 225

[56] References Cited

U.S. PATENT DOCUMENTS

| | | |
|---|---|---|
| 3,479,666 | 11/1969 | Webb . |
| 3,536,800 | 10/1970 | Hubbard . |
| 3,580,772 | 5/1971 | Ochoa . |
| 4,792,808 | 12/1988 | Hildebrand . |

*Primary Examiner*—Don Wong
*Assistant Examiner*—James Clinger
*Attorney, Agent, or Firm*—Allen, Dyer, Doppelt, Milbrath & Gilchrist, P.A.

[57] ABSTRACT

A method for making an RF device, such as an antenna, having a non-planar shape with a high degree of accuracy includes the steps of forming an electrical conductor pattern on a flexible substrate, and positioning the flexible substrate onto the mold having the non-planar shape so that the electrical conductor pattern is exposed. The method also includes forming a rigid layer on the flexible substrate so that the exposed electrical conductor pattern will be transferred to the rigid layer upon separation from the flexible substrate. The rigid layer is separated from the flexible substrate with the electrical conductor pattern remaining on the rigid layer. The method preferably further includes forming an additional thickness of conductive material onto the electrical conductor pattern remaining on the rigid layer. The electrical conductor pattern may be a metal pattern which may be printed onto the substrate. In other embodiments, the electrical conductor pattern on the flexible substrate may be replaced by a seed material that will later be receptive to metal deposition to the define the conductive portions.

39 Claims, 4 Drawing Sheets

METHOD FOR MAKING NON-PLANAR RADIO FREQUENCY DEVICE AND DEVICE PRODUCED THEREBY

FIELD OF THE INVENTION

The present invention relates to the field of radio frequency devices and methods, and, more particularly, to a method for making RF devices and the devices produced thereby.

BACKGROUND OF THE INVENTION

Antennas are widely used in many Radio Frequency (RF) communications systems. A typical directional antenna may include a parabolic reflector, and a feed horn positioned at the focus of the reflector. A waveguide is connected between the processing electronics, that is, receiver or transmitter, and the feed horn. Accordingly, RF signals may be received and/or transmitted.

Another type of common antenna is the phased array antenna which includes a pattern or array of conductive elements, for example. The antenna elements are typically mounted on a planar substrate and supplied with RF energy at different respective phase relationships, such as to provide beam steering without moving the antenna structure. Forming or assembling the conductive elements on a rigid planar substrate is relatively easy.

Yet another type of antenna may desirably have a three-dimensional pattern of conductive elements for more complex beam steering or to handle various polarizations of RF signals. Unfortunately, conventional manufacturing techniques for accurately and efficiently producing such an antenna with a complex pattern of conductive elements have been unsuitable.

Relating to manufacturing of a basic reflector antenna as discussed above, U.S. Pat. No. 3,536,800 to Hubbard discloses a molding process for making radio frequency devices including the reflector antenna, a feed horn and a waveguide, or other RF device having a highly complex conducting surface. A rigid mold is initially constructed to have an outer surface which has the exact contour desired for the RF conducting surface. A parting agent coating is preferably applied over the outer mold surface. A film of metal is formed over the parting agent by spraying fine particles of molten metal onto the outer surface until the metal has a sufficient thickness. The outer face of the metal film is coarse and porous and a layer of plastic is applied onto the outer face and forms a bond therewith. The plastic layer and metal layer are removed from the mold. No additional shaping or forming of the RF conducting surface is necessary.

Unfortunately, the approach described in the Hubbard patent is fairly limited to coating the entire surface with a metal layer, especially where a complex pattern of conductors is required as disclosed, for example, in U.S. Pat. No. 4,792,808 to Hildebrand. This patent is assigned to the assignee of the present invention, and discloses an array of antenna elements distributed over half of an ellipsoid, that is, a geometrical surface defined by half an ellipse of revolution. The antenna may be used for providing complete hemispherical coverage as attractive for airborne communication, and does so with fewer elements and effectively uniform gain as compared with conventional spherical dome or tetrahedral configurations.

It is especially difficult to form an antenna with a spherical portion and a complex pattern of conductors on the interior of the spherical portion as may be desirable in certain applications. The difficulties are further compounded when the radius of curvature for such an antenna are relatively small, such as on the order of a few inches.

SUMMARY OF THE INVENTION

In view of the foregoing background, it is therefore an object of the present invention to provide a method for making an RF device, such as an antenna, having a non-planar shape and with a high degree of accuracy for a relatively complex pattern of electrical conductors.

It is another object of the present invention to provide a method for making an RF device, such as an antenna, and to provide the RF device produced by the method without complicated manufacturing steps or processes.

These and other objects, features and advantages in accordance with the present invention are provided by a method for making a non-planar RF device using a non-planar mold. In particular, the method preferably comprises the steps of forming a conductor pattern on a flexible substrate, and positioning the flexible substrate onto the mold having the non-planar shape so that the conductor pattern is exposed. The method also preferably includes the step of forming a rigid layer on the flexible substrate so that at least a portion of the exposed conductor pattern will be transferred to the rigid layer upon separation from the flexible substrate. The rigid layer and flexible substrate are separated with at least a portion of the conductor pattern remaining on the rigid layer. The step of positioning the flexible substrate onto the mold preferably comprises securing the flexible substrate to the mold so that it conforms to the non-planar shape of the mold. The flexible substrate may comprises rubber, for example.

The method preferably further includes the step of forming an additional thickness of conductive material onto the conductor pattern remaining on the rigid layer. In some embodiments of the invention, the conductor pattern applied to the flexible substrate is a metal pattern which may be printed onto the substrate. In other embodiments, the conductor pattern on the flexible substrate may be replaced by a seed material that will later be receptive to metal deposition to thereby the define the conductive portions of the device.

Another aspect of the invention relates to formation of the pattern on the flexible substrate. Accordingly, the method may further include the step of supporting the flexible substrate in a generally planar orientation during the step of forming the conductor pattern. One approach uses a frame to support the flexible substrate in the planar orientation. The frame may also be readily used to secure the flexible substrate to the mold.

The rigid layer may comprise fiberglass. In other words, the step of forming the rigid layer preferably comprises the steps of forming at least one layer of hardenable material, and hardening the at least one layer. The non-planar shape of the rigid layer may include a generally spherical portion, and the conductor pattern may be formed on the interior of the spherical portion as is especially advantageous for forming certain antenna structures.

Another aspect of the invention relates to an antenna formed by the above described method. More particularly, the antenna preferably comprises a rigid body portion having a generally spherical shape, a predetermined pattern of a first electrically conductive layer on an interior surface of the rigid body portion, and a second electrically conductive layer on the first electrically conductive layer.

Yet another aspect of the invention relates to an intermediate product used during manufacturing of the antenna and comprising: a mold having a non-planar shape; a flexible substrate on the mold; a pattern of a first material on the flexible substrate; a rigid body of material on the flexible substrate with at least a portion of the pattern of first material adhering to the rigid body of material upon separation from the flexible substrate. The substrate may comprise rubber, and the first material may comprise an electrically conductive material, such as a metal.

DETAILED DESCRIPTION OF THE PREFERRED EMBODIMENTS

Figure 1:
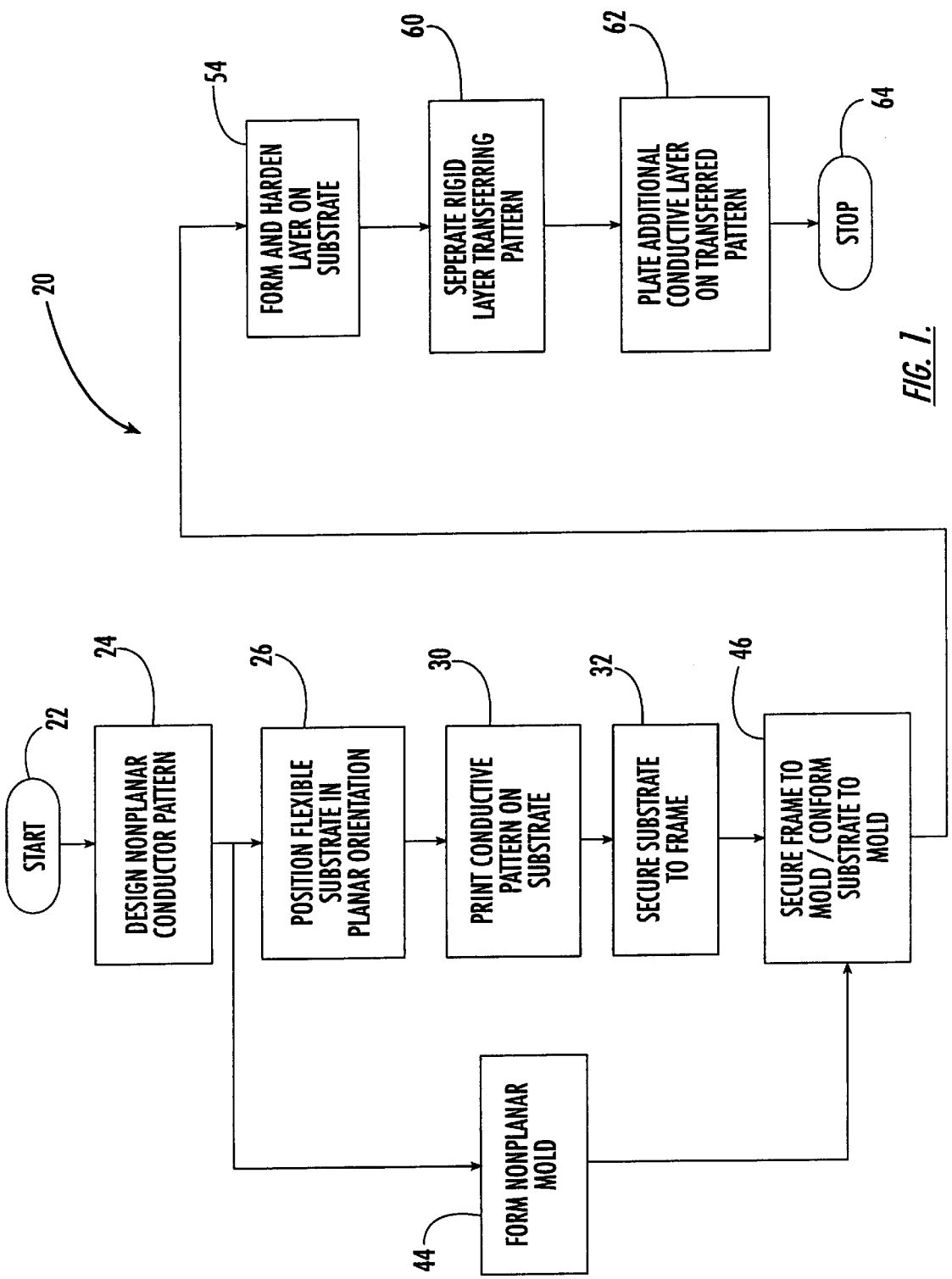
FIG. 1 is a flow chart illustrating the steps of making an antenna or other RF device having a non-planar shape in accordance with the present invention.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout and prime notation is used to indicate similar elements in alternate embodiments. The scaling of various features, particularly layers in the drawing figures, have been exaggerated for clarity of explanation.

Figure 2:
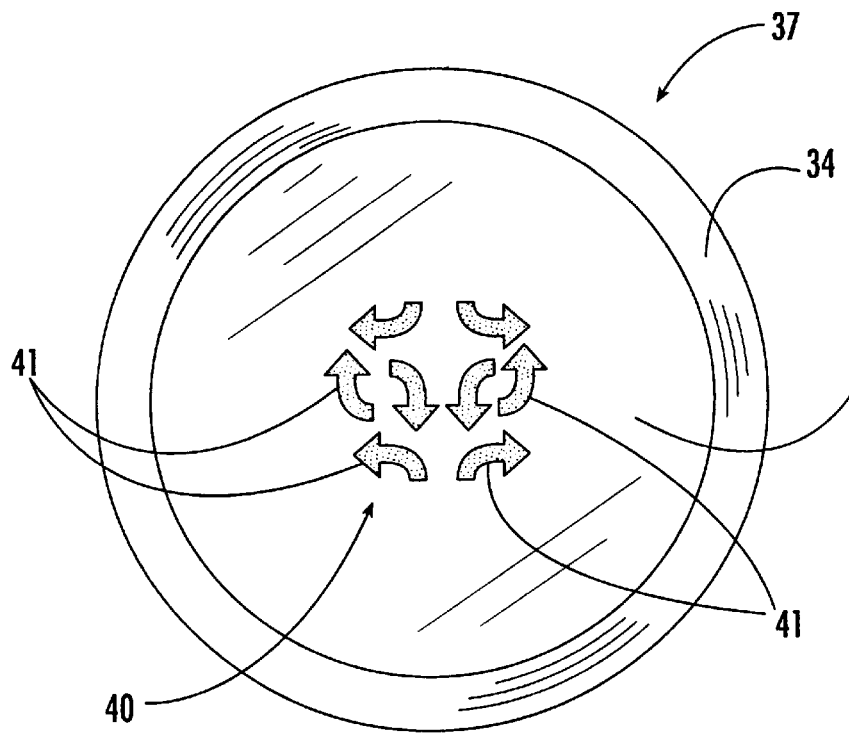
FIG. 2 is a schematic plan view of a flexible substrate connected to a mounting frame in accordance with the present invention.
Figure 3:
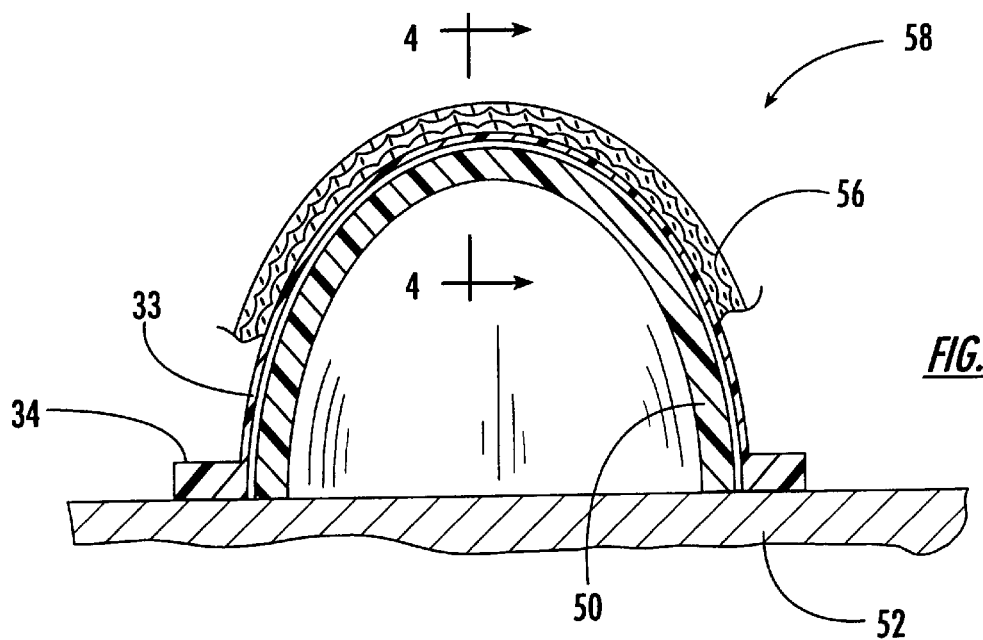
FIG. 3 is a schematic cross-sectional diagram of the flexible substrate and supporting frame positioned on a mold in an intermediate product in accordance with the present invention.
Figure 4:
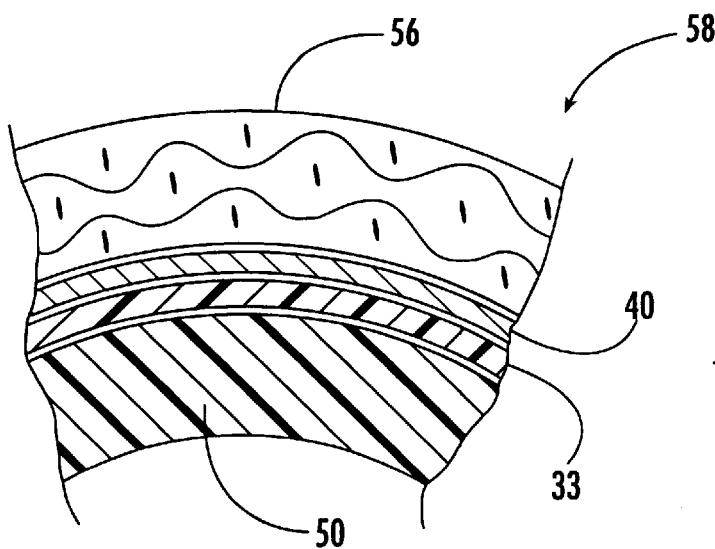
FIG. 4 is an enlarged schematic cross-sectional view along lines 4—4 of FIG. 3.

Referring initially to the flow chart 20 of FIG. 1, and the illustrations of FIGS. 2 through 4, the method and various intermediate products in accordance with the present invention are first described. The method is for making a non-planar RF device using a non-planar mold. The term RF is used to generally describe electromagnetic energy which will propagate in free space or other medium without direct wire connections, and is not intended to be limited to any particular frequency band. In the illustrated embodiment, the non-planar RF device is an antenna having a generally spherical portion and a relatively complex metallization pattern on an interior portion. The prior art molding processes have not proven satisfactory for efficiently and easily producing such structures.

From the start (Block 22), the user may design a non-planar conductor pattern (Block 24). For example, using computer or manual techniques as would be readily understood by those skilled in the art. As described in Block 26, the method next includes the step of positioning a flexible or conformable substrate in a generally planar or two-dimensional orientation. The flexible substrate may preferably be a silicon rubber, latex rubber, or other similar flexible relatively thin sheet material and that can receive a conductor pattern thereon as will be readily appreciated by those skilled in the art.

The conductor pattern may be formed on the flexible substrate (Block 30), such as by conventional screen printing techniques. The conductor pattern may be polymer copper material or other suitable conductive material as will be readily appreciated by those skilled in the art. The thus patterned substrate 33 may be joined to a frame 34 to define an intermediate product or assembly generally designed by reference numeral 37 as understood with particular reference to FIG. 2. Of course, the flexible substrate 33 may be mounted to the frame 34 prior to and during the conductor printing operation. The conductor pattern 40 illustratively includes a plurality of conductive portions 41 in the form of arrows with stippling added to further indicate the conductive portions. The conductor pattern 40 may have a thickness of from about 0.0004 to 0.0015 inches, for example.

At Block 46 the intermediate assembly 37 may be secured to the non-planar mold which was shaped or formed at Block 44. Of course, the flexible substrate 33 takes the shape of the underlying mold 50 as understood with particular reference to FIG. 3 where the mold is positioned on a table 52 or other suitable work surface.

One or more hardenable layers may be applied to the now-shaped flexible substrate 33 and allowed to cure or harden (Block 54). For example, fiberglass may be used to form the hardenable or rigid layer 56 as shown in FIG. 3. This rigid layer 56 in combination with the flexible substrate 33 and the mold 50 defines a second intermediate product or assembly 58. In addition, the rigid layer 56 will ultimately provide or define the body of the antenna. Accordingly, the rigid layer 56 is preferably a dielectric material. Those of skill in the art will appreciate that other curable, moldable, and/or hardenable materials may be used for the rigid layer.

At Block 60, the rigid layer 56 is removed from the flexible substrate 33. The flexible substrate 33 may itself thus define a release layer to permit the transfer of the conductor pattern 40 to the rigid layer 56. The conductor pattern 40 preferentially bonds to the rigid layer 56. Alternately, a release layer or coating may be applied or sprayed onto the surface of the substrate 33 prior to printing the conductor pattern 40 thereon as will be readily appreciated by those skilled in the art to enhance or supply the release function. For example, if the flexible substrate 33 is formed of silicon rubber, no additional release coating may be needed. In addition, although in the illustrated embodiment the entire thickness of the conductor pattern 40 is transferred to the rigid layer 56, this is not necessarily essential as long as at least a portion of the conductor pattern is transferred.

At Block 62 an additional conductive or metal layer may be added to the transferred conductor pattern. For example, where copper is used for the conductor pattern 40 on the substrate 33, the copper surface is preferably protected from corrosion by one or more additional layers, such as gold or nickel, for example. Those of skill in the art will also readily appreciate that the thickness of the transferred conductor pattern 40 may also need to be thickened for current-carrying or other structural reasons. The illustrated method stops at Block 64, although there may be various finishing operations performed as will also be appreciated by those skilled in the art.

In another embodiment of the invention, instead of a conductor pattern 40, a pattern of a seed material may be formed. Accordingly, once the patterned seed layer is transferred to the rigid layer 56, the deposition or formation of the electrically conductive portions may be facilitated. Those of skill in the art will appreciate materials suitable for the seed layer without further discussion herein.

Figure 5:
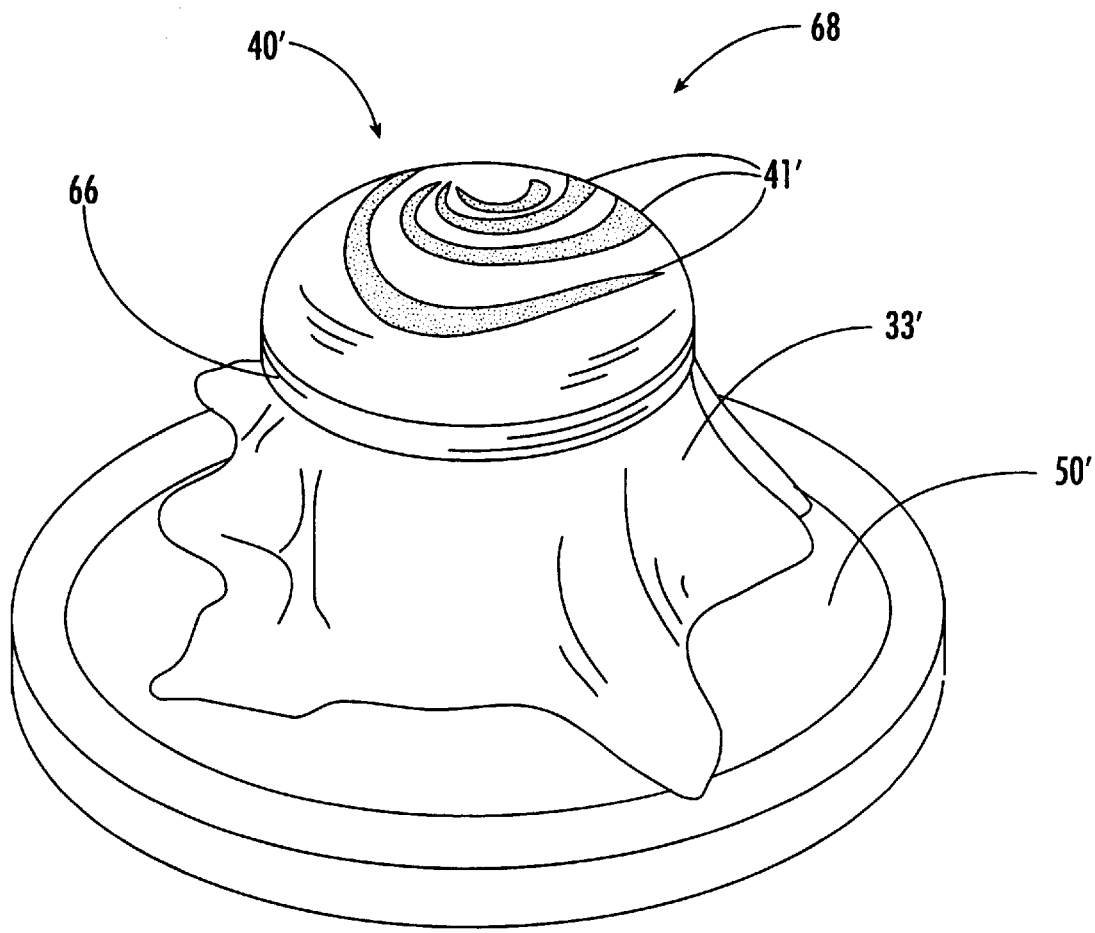
FIG. 5 is a perspective view of another intermediate product in accordance with the present invention.
Figure 6:
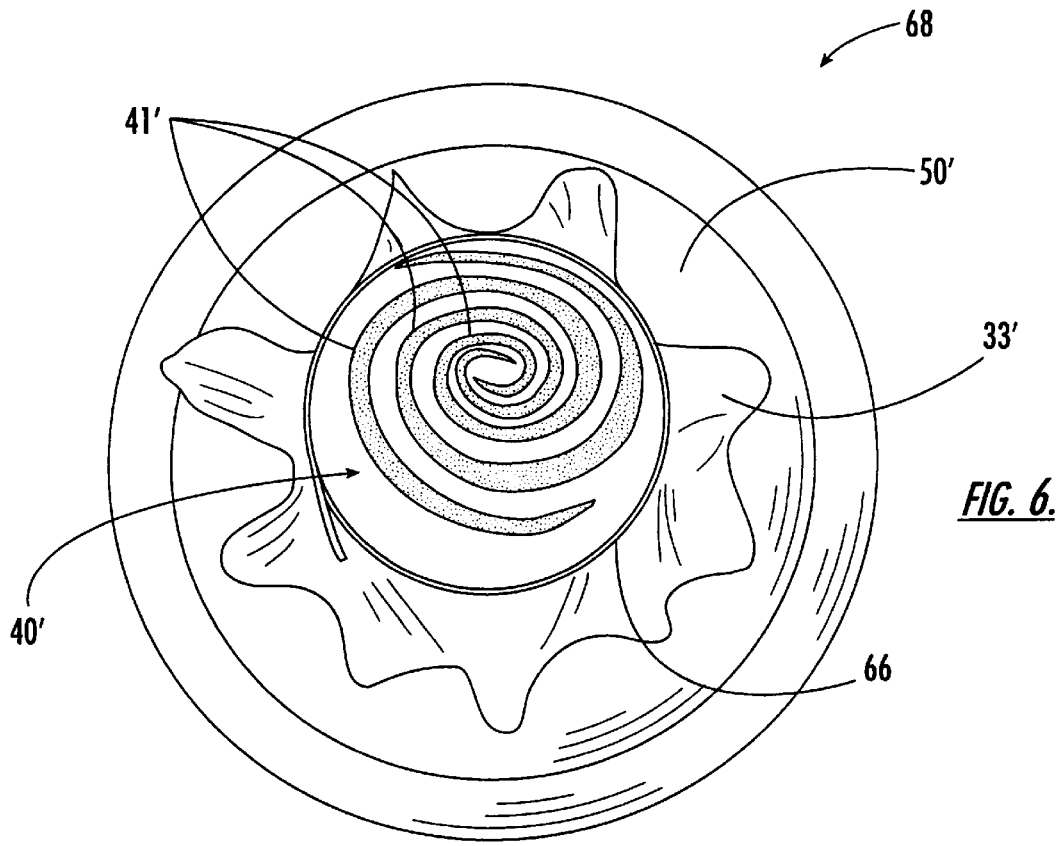
FIG. 6 is a top plan view of the intermediate product as shown in FIG. 5.
Figure 7:
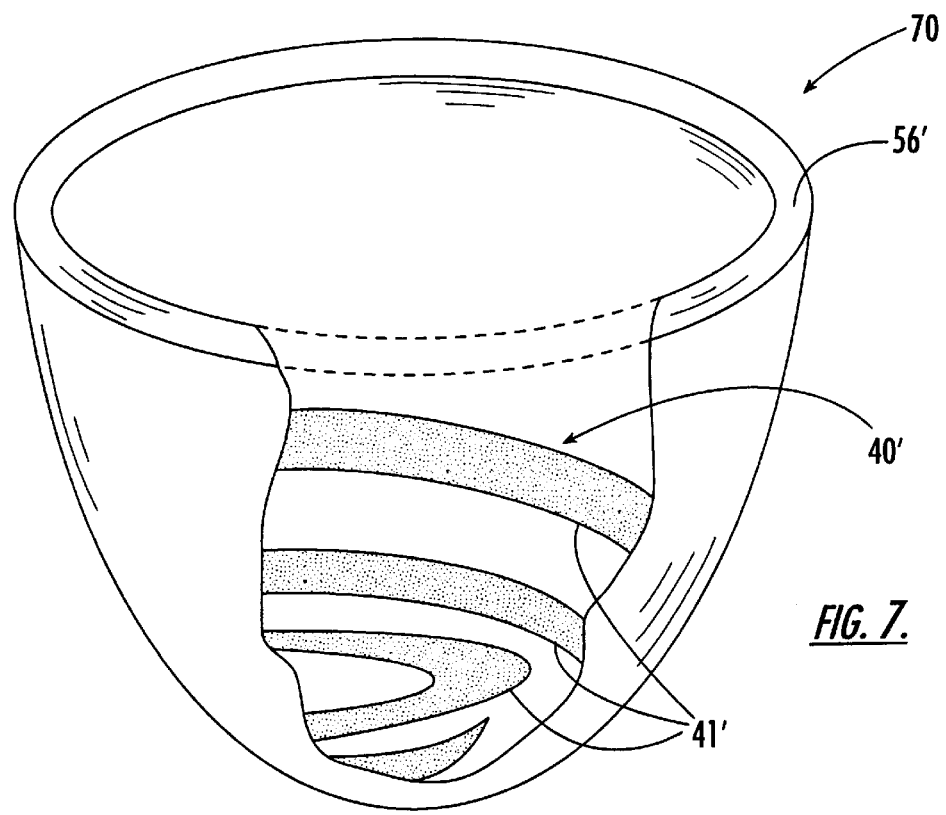
FIG. 7 is a fragmentary schematic perspective view of an antenna in accordance with the present invention.

Turning now additionally to FIGS. 5 through 7 the method, another intermediate structure 68, and the antenna 70 produced thereby are further explained. The flexible substrate 33' is secured to the mold 50' by the illustrated band 66 to define the intermediate assembly 68. In some embodiments, the frame which mounts the flexible substrate may provide the securing band. The conductor pattern 40' is illustratively configured to transmit or receive a circularly polarized signal as will be readily appreciated by those skilled in the art. The rigid layer may be added to the substrate 33' as described above. Upon removal and trimming, the rigid layer 56' defines a body portion for the antenna 70 (FIG. 7) and includes the complex conductor pattern 40' on its spherical interior surface. Additional supporting or mounting structures may be added to the rigid layer 56 as will be appreciated by those skilled in the art.

In summary, the method of the present invention includes the step of pre-metalizing a conformable substrate, such as rubber, which can then conform and stretch over a non-planar mold portion. Fiberglass or other hardenable material is laid over the substrate as supported by the mold. The mold and substrate are removed, leaving the metal or conductor pattern on the interior surface of the fiberglass body. The metal pattern can be further plated. The method is particularly advantageous for forming complex three-dimensional shapes and conductor patterns for antennas, although other RF devices may also be readily formed in accordance with the present invention, as will be appreciated by those skilled in the art. The method is particularly useful for an antenna including a generally spherical portion having a radius of curvature as sharp as 4 inches. Of course, the method can also be readily used for radii of curvature of up to several feet as well.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. A method for making a non-planar radio frequency (RF) device using a mold having a corresponding non-planar shape including a generally spherical portion, the method comprising the steps of:

forming an electrical conductor pattern on a flexible substrate;

positioning and stretching the flexible substrate onto the mold having the non-planar shape including the generally spherical portion so that the electrical conductor pattern is exposed;

forming a rigid layer on the flexible substrate so that at least a portion of the exposed electrical conductor pattern will be transferred to the rigid layer upon separation from the flexible substrate; and separating the rigid layer from the flexible substrate with at least a portion of the electrical conductor pattern remaining on the rigid layer.

2. A method according to claim 1 wherein the step of positioning and stretching the flexible substrate onto the mold comprises securing the flexible substrate to the mold so that it conforms to the non-planar shape including the generally spherical portion of the mold.

3. A method according to claim 1 further comprising the step of forming an additional thickness of conductive material onto the at least a portion of the electrical conductor pattern remaining on the rigid layer.

4. A method according to claim 3 wherein the step of forming the electrical conductor pattern on the flexible substrate comprises forming a metal pattern on the flexible substrate; and wherein the step of forming an additional thickness of conductive material comprises plating additional metal onto the metal pattern.

5. A method according to claim 1 wherein the step of forming the electrical conductor pattern on the flexible substrate comprises forming a metal pattern.

6. A method according to claim 1 further comprising the step of supporting the flexible substrate in a generally planar orientation during the step of forming the electrical conductor pattern.

7. A method according to claim 1 further comprising the step of supporting the flexible substrate on a frame.

8. A method according to claim 1 wherein the step of forming the electrical conductor pattern on the flexible substrate comprises printing a metal polymer onto the flexible substrate.

9. A method according to claim 1 wherein the flexible substrate comprises rubber.

10. A method according to claim 1 wherein the rigid layer comprises fiberglass.

11. A method according to claim 1 wherein the step of forming the rigid layer comprises the steps of forming at least one layer of hardenable material, and hardening the at least one layer.

12. A method according to claim 1 wherein the non-planar shape of the rigid layer includes a generally spherical portion.

13. A method according to claim 12 wherein the RF device is an antenna; and wherein the at least a portion of the electrical conductor pattern is transferred to an interior of the generally spherical portion of the rigid layer of the antenna.

14. A method for making a non-planar Radio Frequency (RF) device including conductive portions using a mold having a corresponding non-planar shape including a generally spherical portion, the method comprising the steps of:

forming a pattern of a first material on a flexible substrate;

positioning and stretching the flexible substrate onto the mold having the non-planar shape including the generally spherical portion so that the pattern of the first material is exposed;

forming a rigid layer on the flexible substrate and separating the rigid layer from the flexible substrate so that at least a portion of the exposed pattern of the first material is transferred to and remains on the rigid layer upon separation from the flexible substrate; and forming a layer of electrically conductive material on the pattern of first material remaining on the rigid layer.

15. A method according to claim 14 wherein the step of positioning and stretching the flexible substrate onto the mold comprises securing the flexible substrate to the mold so that it conforms to the non-planar shape including the generally spherical portion of the mold.

16. A method according to claim 14 wherein the step of forming the pattern of first material on the flexible substrate comprises forming a metal pattern on the flexible substrate;

and wherein the step of forming the layer of electrically conductive material comprises plating additional metal onto the metal pattern.

17. A method according to claim 14 further comprising the step of supporting the flexible substrate in a generally planar orientation during the step of forming the electrical conductor pattern.

18. A method according to claim 14 further comprising the step of supporting the flexible substrate on a frame.

19. A method according to claim 14 wherein the step of forming the pattern of the first material on the flexible substrate comprises printing a metal polymer onto the flexible substrate.

20. A method according to claim 14 wherein the step of forming the pattern of the first material on the flexible substrate comprises forming a pattern of a seed material onto the flexible substrate to selectively receive a metal layer thereon.

21. A method according to claim 14 wherein the step of forming the rigid layer comprises the steps of forming at least one layer of hardenable material, and hardening the at least one layer.

22. A method according to claim 14 wherein the non-planar shape of the rigid layer includes a generally spherical portion.

23. A method according to claim 21 wherein the RF device is an antenna; and wherein the electrically conductive material is formed on an interior of the generally spherical portion of the rigid layer of the antenna.

24. A method for making a non-planar antenna including electrically conductive portions using a mold having a corresponding non-planar shape including a generally spherical portion, the method comprising the steps of:

forming an electrical conductor pattern on a flexible substrate;

positioning and stretching the flexible substrate onto the mold having the non-planar shape including the generally spherical portion so that the electrical conductor pattern is exposed; and forming a rigid layer on the flexible substrate and separating the rigid layer from the flexible substrate so that at least a portion of the exposed electrical conductor pattern is transferred to and remains on the rigid layer upon separation from the flexible substrate.

25. A method according to claim 24 wherein the step of positioning and stretching the flexible substrate onto the mold comprises securing the flexible substrate to the mold so that it conforms to the non-planar shape including the generally spherical portion of the mold.

26. A method according to claim 24 further comprising the step of forming a layer of electrically conductive material on the electrical conductor pattern remaining on the rigid layer.

27. A method according to claim 26 wherein the step of forming the electrical conductor pattern on the flexible substrate comprises forming a metal pattern on the flexible substrate; and wherein the step of forming the layer of electrically conductive material comprises plating additional metal onto the metal pattern.

28. A method according to claim 24 further comprising the step of supporting the flexible substrate in a generally planar orientation during the step of forming the electrical conductor pattern.

29. A method according to claim 24 further comprising the step of supporting the flexible substrate on a frame.

30. A method according to claim 24 wherein the step of forming the electrical conductor pattern on the flexible substrate comprises printing a metal polymer onto the flexible substrate.

31. A method according to claim 24 wherein the step of forming the rigid layer comprises the steps of forming at least one layer of hardenable material, and hardening the at least one layer.

32. A method according to claim 24 wherein the non-planar shape of the rigid layer includes a generally spherical portion for the antenna; and wherein the electrically conductive material is formed on an interior of the generally spherical portion of the rigid layer of the antenna.

33. An antenna comprising:

a rigid body portion having a generally spherical shape;

a predetermined pattern of a first electrically conductive layer on an interior surface of said rigid body portion including the generally spherical shape; and a second electrically conductive layer on said first electrically conductive layer.

34. An antenna according to claim 33 wherein said rigid body portion comprises fiberglass.

35. An antenna according to claim 33 wherein the first electrically conductive layer comprises copper; and wherein said second electrically conductive material comprises at least one of gold and nickel.

36. An intermediate product used during manufacturing of an antenna and comprising:

a mold having a non-planar shape including a generally spherical portion;

a flexible substrate on said mold including the generally spherical portion;

a pattern of a first material on said flexible substrate; and a rigid body of material on said flexible substrate with at least a portion of the pattern of first material adhering to the rigid body of material upon separation from the flexible substrate.

37. An intermediate product according to claim 36 wherein said flexible substrate comprises rubber.

38. An intermediate product according to claim 36 wherein said first material comprises a metal.

39. An intermediate product according to claim 36 wherein said body of rigid material comprises fiberglass.

* * * * *